(12) United States Patent
Nordquist et al.

(10) Patent No.: US 10,418,443 B1
(45) Date of Patent: Sep. 17, 2019

(54) ION TRAPPING FOR QUANTUM INFORMATION PROCESSING

(71) Applicant: National Technology & Engineering Solutions of Sandia, LLC, Albuquerque, NM (US)

(72) Inventors: Christopher Nordquist, Albuquerque, NM (US); Christopher W. Berry, Mountain View, CA (US); Peter Lukas Wilhelm Maunz, Albuquerque, NM (US); Matthew G. Blain, Albuquerque, NM (US); Jonathan David Sterk, Albuquerque, NM (US); Paul J. Resnick, Albuquerque, NM (US); John F. Rembetski, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 401 days.

(21) Appl. No.: 15/424,158

(22) Filed: Feb. 3, 2017

Related U.S. Application Data

(60) Provisional application No. 62/291,125, filed on Feb. 4, 2016.

(51) Int. Cl.
*H01L 29/12* (2006.01)
*G06N 10/00* (2019.01)
*H01J 49/42* (2006.01)

(52) U.S. Cl.
CPC .......... *H01L 29/122* (2013.01); *H01J 49/422* (2013.01); *G06N 10/00* (2019.01); *H01J 49/424* (2013.01)

(58) Field of Classification Search
CPC ...... G06N 10/00; H01J 49/422; H01J 49/424; H01L 29/122
See application file for complete search history.

(56) References Cited

U.S. PATENT DOCUMENTS 10,134,972 B2 * 11/2018 Oliver ................. H01L 25/0657
2011/0234219 A1 * 9/2011 Boehi .................... G01R 33/10
324/260

(Continued)

OTHER PUBLICATIONS

Carsjens, M., et al. "Surface-electrode Paul trap with optimized near-field microwave control." Applied Physics B114.1-2 (2014): 243-250. (Year: 2014).*

(Continued)

*Primary Examiner* — Wyatt A Stoffa
(74) *Attorney, Agent, or Firm* — Martin I. Finston; Eugene J. Rosenthal; Capitol Patent & Trademark Law Firm, PLLC (57) ABSTRACT

A platform for trapping atomic ions includes a substrate and a plurality of metallization layers that overlie the substrate. The metallization layer farthest from the substrate is a top layer patterned with electrostatic control trap electrodes and radio-frequency trap electrodes. Another metallization layer is a microwave layer patterned to define a microwave circuit. The microwave layer lies below the top layer. The microwave circuit is adapted to generate, in use, a microwave magnetic field above the electrostatic control and radio-frequency trap electrodes. The top metallization layer includes slots that, in use, are penetrated by microwave energy from the microwave circuit.

19 Claims, 9 Drawing Sheets

(56) References Cited

U.S. PATENT DOCUMENTS

2011/0290995 A1* 12/2011 Kumph ............... H01J 49/0018
250/282
2016/0322188 A1* 11/2016 Youngner ................. H01J 3/38

OTHER PUBLICATIONS

Allcock. D.T.C., et al., "A microfabricated ion trap with integrated microwave circuitry", Applied Physics Letter, 2013, 044103, vol. 102.

Brown, K.R. et al., "Single-qubit-gate error below 10-4 in a trapped ion", Physical Review A, 2011, 030303(r), vol. 84.

Chiaverini, J. et al., "Laserless trapped-ion quantum simulations without spontaneous scattering using microtrap arrays", Physical Review A, 2008, 022324, vol. 77.

Craik, D. P. L. et al., "Microwave control electrodes for scalable, parallel, signle-qubit operations in a surface-electrode ion trap", Applied Physics B—Lasers and Optics, 2014, pp. 3-10, vol. 114.

Harty, T. P. et al., "High-Fidelity Preparation, Gates, Memory, and Readout of a Trapped-Ion quantum Bit", Physical Review Letters, 2014, 220501, vol. 113.

Highstrete, C. et al., "Technology for On-Chip Qubit Control with Microfabricated Surface Ion Traps", SAND2013-9513, 2013.

Kunert, P. J. et al., "A planar ion trap chip with integrated structures for a tailorable magnetic field gradient", Applied Physics B, 2014, pp. 27-36, vol. 114.

Mintert, F. et al., "Ion-trap Quantum Logic Using Long-Wavelength Radiation", Physical Review Letters, 2001, 257904, vol. 87.

Nordquist, C. D. et al., "A Microfabricated Ion Trap Designed for Microwave Induced Ion Interactions", SAND2015-0551PE, 2015, Feb. 6, 2015.

Ospelkaus, C. et al., "Microwave quantum logic gates for trapped ions", Nature, 2011, vol. 476, pp. 181-184.

Ospelkaus, C. et al., "Trapped-Ion Quantum Logic Gates Based on Oscillating Magnetic Fields", Physical Review Letters, 2008, 090502, vol. 101.

Shappert, C. M. et al., "Spatially uniform single-qubit operations with near-field microwaves and composite pulse compensation", New Journal of Physics, 2013, 083503, vol. 15.

Wang, S. X. et al., "Individual addressing of ions using magnetic field gradients in a surface-electrode ion trap", Applied Physics Letters, 2009, 094103, vol. 94.

Warring, U. et al., "individual-Ion Addressing with Microwave Field Gradients", Physical Review Letters, 2013, 173002, vol. 110.

Warring, U. et al., "Techniques for microwave near-field quantum control of trapped ions", Physical Review A, 2013, 013437, vol. 87.

* cited by examiner

ION TRAPPING FOR QUANTUM INFORMATION PROCESSING

CLAIM OF PRIORITY

This application claims the benefit of U.S. provisional application No. 62/291,125 filed on Feb. 4, 2016, the entire contents of which are herein incorporated by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The invention relates to methods and apparatus for providing trapped atomic ion quantum bits.

BACKGROUND OF THE INVENTION

Quantum information processing promises to perform some significant tasks far more efficiently than can be accomplished classically. Important examples of possible applications include quantum computation, quantum simulation, and quantum communication. Physical systems of various kinds are under consideration for quantum information processing. Trapped atomic ions constitute one such physical system and they are, in fact, a promising physical qubit candidate for developing quantum computation.

Individual qubits are defined in the trapped atomic ion system by isolating two quantized energy levels of the ion's configuration. Different states can include configurations of various properties of the atomic electron and nucleus such as electron orbit, electron spin, and nuclear spin. However, since the state of the electron is always involved, it is convenient to refer to them as electronic states and transitions between them as electronic transitions. These quantum electronic states can be separated by energy differences corresponding to electromagnetic excitation from radio frequencies (RF) to optical wavelengths. Controlled electronic transitions are performed by applying excitation pulses of electromagnetic fields at the corresponding frequency (or equivalently, wavelength).

There are two important types of operations carried out in quantum information processing with trapped ions. Manipulation of an individual ion to control its electronic quantum state configuration, as mentioned above, is known as a single qubit rotation. This term refers to the mathematical rotation of the quantum state vector in the Bloch-sphere representation and is analogous to the rotation of the spin vector in Nuclear Magnetic Resonance (NMR).

Additionally, trapped ions can be made sufficiently cold (i.e. their motion sufficiently suppressed by, for instance, laser cooling) so that the state of their motion may also be described quantum mechanically. Ion motion is then described by quantized levels of excitation (energy levels) of a quantum harmonic oscillator. Using excitation pulses tuned to the electronic transition plus or minus the harmonic-oscillator energy level spacing, changes in the ion's electronic state configuration can be coupled to changes in its amount of harmonic oscillator motional excitation, either increasing or decreasing its motional energy. With single or multiple qubits, excitation of these motional modes requires significant electromagnetic field gradients on the scale of the ion motion, which is typically on the order of 10 nm.

For quantum information processing, it is necessary to interact ions together in order to perform processing operations with the information stored in the different qubits, similar to performing logic operations with different bits in a classical computer.

The primary means of doing this is to trap ions together in a linear chain, so that they are separated by, and interact through, their electrostatic (Coulomb) repulsion. Then, instead of single ion harmonic oscillator motional excitations, there are collective modes of oscillation for all of the ions.

Two simple examples of collective modes are: (1) the center of mass (COM) mode for two ions, where the ions move jointly side to side, and (2) the stretch mode, where the ions oscillate towards and away from each other. By tuning excitation pulses to an ion's electronic state transition plus or minus the oscillation mode energy level spacing, changes in an ion's electronic state configuration are coupled to changes in the amount of motional excitation in that mode. Because this excitation involves other ions, exciting their motion as well, the overall (electronic+motional) quantum states of the various ions interact and their quantum states become entangled.

Because of this entanglement, the occurrence of a quantum transition involving multiple ions in response to an electromagnetic pulse can be made conditional on the initial states of the qubits, thus enabling quantum logic operations. Controlled interactions of this sort between qubits are the second operation necessary to perform quantum information processing and are known as multi-qubit gates, analogous to gate operations with multiple bits in classical computation.

To date, qubit rotations and gates are performed primarily with tightly focused laser beams. This is done either with direct excitation of electronic energy levels separated by energies corresponding to optical wavelengths (optical qubits) or indirectly with simulated Raman transitions, where two laser beams are applied at wavelengths that are separated by the required transition frequency.

Raman transitions are normally used to stimulate transitions between electronic states defined by the hyperfine interaction between the atomic nucleus and the electron in odd-isotope atoms (i.e. atoms with net nuclear spin). This interaction causes an energy splitting of the electronic ground state into multiple levels which are separated by energies corresponding to microwave frequencies. These qubits are commonly known as hyperfine qubits or, alternatively, clock states because of their widespread use in atomic-clock applications.

Most current schemes for quantum information processing with trapped ions use laser-induced interactions to implement the necessary qubit rotations and gates with one-dimensional chains of trapped ions. Whereas laser-based schemes have been successful in manipulating small numbers of ions, scaling up to larger register sizes and/or multiple quantum registers will demand a large overhead in laser-beam power and control. Additionally, multi-qubit gates rely on the ability to spectrally isolate a single motional mode of an ion chain. Because there are 3N modes of motion for N trapped ions, increasing N to large values can make the mode spectrum so dense that the gate speeds must be significantly reduced to avoid off-resonant coupling to other modes. Reduction of gate speeds is highly detrimental to quantum computing because decoherence of the qubits in time limits the fidelity of the operations. As a result, large numbers of qubits must be dedicated to performing error correction, thus escalating critical system resource requirements.

The alternative to one-dimensional ion chains is to distribute the ion qubits in an array of multiple trap zones. In that architecture, gate operations can be carried out on a relatively small number of ions in multiple processing zones. Interactions are facilitated by physically moving the ions to different zones for different operations in a "quantum CCD bus" architecture, analogous to movement of charges on a solid-state CCD image sensor. Yet even there, optical qubits require laser beams to be applied in several locations simultaneously for parallel operations. Moreover, spontaneous emission and technical difficulties associated with stabilizing laser frequency, phase, amplitude, and beam pointing have kept optical qubit gate fidelities below fault-tolerant levels and are likely to remain a limiting factor for some time.

The shortcomings of lasers for qubit operations can be overcome by using, instead, microwave magnetic fields to directly manipulate hyperfine qubits. These clock states are commonly used for atomic frequency standards because they are highly stable; they are practically immune to decoherence by spontaneous emission, and they are readily addressed by highly stable, commercial-off-the-shelf (COTS) microwave sources.

To date, the advantages of using microwave magnetic fields have not been realized because for free-space microwaves, their long wavelength precludes focusing, causing all qubits to be simultaneously addressed, and because only negligible field gradients can be produced on the ion-motion scale, precluding coupling to motional modes.

To overcome these issues, microfabricated ion traps offer a solution: microwave electrodes with sub-wavelength dimensions can localize fields to individually address subsets of qubits and generate sufficient magnetic field gradients to excite entangling motional modes.

A practical quantum-information processor based on microwave manipulation of qubits will need to have electromagnetically isolated regions where qubit preparations and interactions are accomplished with microwave fields delivered with on-chip waveguides. To achieve this, progress is needed in integrating high magnetic field gradients and microwaves on-chip with effective field localization. This will involve relatively high current densities to provide sufficient field strengths and field gradients. Progress is also needed in shielding or cancelling of microwave fields from other zones to minimize unintentional qubit manipulations due to crosstalk.

Integrated microwave addressing in ion traps offers a physical implementation for future quantum information processing systems. Addressing the hyperfine states of specific trapped ions to achieve single-qubit and two-qubit rotations using microwaves instead of lasers has the potential to reduce the quantity and required purity of lasers required for these operations, potentially reducing the complexity and improving the fidelity of quantum information processing.

Because of the large physical wavelength of the microwave signal relative to the ion, integration into the structure of the ion trap is required to achieve localized near-field coupling of the microwave magnetic field with the ion. Generally, single-qubit and two-qubit operations require two different field profiles at the ion location: a uniform microwave magnetic field density for single-qubit operations, and a microwave magnetic field with zero magnitude and a high gradient for two-qubit operations.

Prior efforts to integrate microwave electrodes into microfabricated ion traps have demonstrated both single-qubit and two-qubit operations with good fidelity. NIST has demonstrated single-qubit gates with <$10^{-4}$ error using beryllium ($^9Be^+$) ions addressed at 1.25 GHz, individual addressing of magnesium ($^{25}Mg^+$) ions using field gradients at 1.687 GHz, and entangled Mg qubits addressed at 1.69 GHz. These results have been achieved with a microfabricated ion trap consisting of a single layer of thick (8-11 µm) gold traces on quartz or aluminum nitride (AlN) substrates, offering both high current handling capability and low microwave loss, and good thermal management in the AlN case.

The University of Oxford has reported single-qubit operations with good fidelity using calcium ($^{43}Ca^+$) ions addressed using three microwave wires at 3.2 GHz, with proposals for more complex electrode designs to allow addressing and correction at neighboring sites.

GTRI reports single-qubit rotations in $^{171}Yb^+$ addressed at 12.6 GHz using a trap with two 1 µm-thick aluminum (Al) coplanar waveguides separated from an Al ground plane on a silicon substrate by 10 µm of silicon dioxide ($SiO_2$) dielectric. Additional relevant work includes traps with integrated electrodes that carry DC currents to generate static magnetic field gradients.

Although progress has been made, it has proven challenging, for several reasons, to integrate microwave electrodes with a microfabricated ion trap. First, the characteristic dimensions of the integrated microwave "antennas" are similar to those of the RF and control electrodes that are used to position the ion in space above the trap, requiring co-location of the microwave structures with the rest of the ion traps. Second, the on-chip traces, as well as the feed to the trap, must have sufficient frequency range and bandwidth to deliver the microwave signals efficiently from the microwave source to the coupling structures. Finally, high field gradient operation requires high microwave currents, requiring larger conductor cross-sections and good thermal management.

SUMMARY OF THE INVENTION

We have recognized, in accordance with the principles of the invention, that microwaves may be emitted from electrical conductors on one or more of the lower layers of a surface/planar-thin-film ion trap which are shielded from the trapping region by metal layers in which there are gaps. The microwaves work their way up through the gaps to the trapping region. So long as there is no continuous path through the metal layers and other circuitry above the microwave emitters, if any, to the trapping region the trapping region above the trap surface is shielded from the microwave fields.

Given the foregoing, we have developed a new platform for delivering microwave fields in ion traps. Our new platform uses microwave circuitry that is embedded beneath the top metal layer of the platform. More specifically, the platform is fabricated with multiple metallization layers. The microwave circuitry is routed typically on one or more of a lower metal layer, and the microwave fields that are generated penetrate through patterned gaps of the higher metal layers.

Such an arrangement allows for the top metal layer to be devoted completely to the electrode patterns responsible for trapping the ion without interference from the microwave structures, e.g., emitters and other circuitry, below. Also, it allows for complex microwave structures to be integrated within the trap with minimal modification to the trap design.

This arrangement also allows for embodiments of the invention that employ metal shielding at intermediate metallization levels so as to give rise to complete metal coverage from the perspective of the ion. This limits interference with the trapped ion due to electrostatic fields arising from unwanted electrical charging, while still allowing the microwave fields to penetrate through the metal layers.

Still further, embodiments of the invention are possible in which the microwave traces are placed directly on the substrate, which aids in thermal management by providing a more effective cooling pathway.

The principles of the invention may be embodied in an ion-trapping platform that includes a substrate and a plurality of metallization layers that overlie the substrate. The metallization layer farthest from the substrate is a top layer patterned with low-frequency electrostatic control trap electrodes and radio-frequency trap electrodes. Another metallization layer is a microwave layer patterned to define a microwave circuit. The microwave layer lies below the top layer. The microwave circuit is adapted to generate, in use, a microwave magnetic field above the electrostatic control and radio-frequency trap electrodes. The top metallization layer includes slots that, in use, are penetrated by microwave energy from the microwave circuit.

In some embodiments of the invention, the microwave layer may be a bottom layer that lies adjacent to the substrate.

In some embodiments of the invention, the substrate may include a silicon body overlain by a heterolayer of insulator or semiconductor, and the microwave layer is adjacent to the heterolayer. In other embodiments of the invention, the heterolayer may be more thermally conductive than silicon.

In some embodiments of the invention, the slots may at least partly surround electrodes of the top layer.

In some embodiments of the invention, a further metallization layer, referred to here as a shield layer, may lie between the microwave layer and the top layer. The shield layer is patterned with a plurality of metal regions, each of which lies directly beneath a corresponding slot of the top layer. In further embodiments of the invention, an air gap may extend from each slot down to its corresponding metal region of the shield layer.

In some embodiments of the invention, the ion-trapping platform may have a four-level metallization structure. Such an embodiments of the invention may include a metal layer M1 nearest the substrate, overlain in succession by metal layers M2, M3, and M4. M1 is the microwave layer, M3 is the shield layer, and M4 is the top layer patterned with trap electrostatic control electrodes and radio-frequency trap electrodes.

Other embodiments of the invention may employ additional metal layers.

In some embodiments of the invention, the ion-trapping platform may have a five-level metallization structure. Such embodiments of the invention may include a metal layer M1 nearest the substrate, overlain in succession by metal layers M2, M3, M4, and M5. M1 is the microwave layer, M4 is the shield layer, and M5 is the top layer patterned with trap electrostatic control electrodes and radio-frequency trap electrodes.

In some embodiments of the invention, part of the top layer may be a ground plane and part of the microwave layer is a ground plane.

In some embodiments of the invention, the microwave circuit in the microwave layer may include a pair of complete, or nearly complete, concentric loops arranged so that when energized, each said loop generates a microwave-frequency magnetic field having a component directed perpendicular to the microwave layer.

The principles of the invention may be implemented as various methods for manipulating energy states of an atomic ion. In one embodiment of the invention, such a method may include energizing electrostatic control and radio-frequency trapping electrodes on the top surface of a platform so as to generate trapping fields, and trapping an atomic ion within the trapping fields at a trapping distance above the top surface of the platform.

The method may further include energizing a microwave circuit that lies within the platform beneath the trapping electrodes so as to generate a microwave-frequency magnetic field above the top surface of the platform, where the magnetic field has a normal component directed perpendicular to the top surface of the platform.

In some embodiments of the invention, the operation of energizing the microwave circuit may include energizing two concentric complete, or nearly complete, loops such that the currents that the respective loops are carrying generate respective magnetic fields having oppositely-directed normal components.

In some embodiments of the invention, the operation of energizing the microwave circuit further includes setting the currents in the respective loops so as to produce a null in the normal component of the magnetic field at the trapping distance above the top surface of the platform.

In some embodiments of the invention, the trapped atomic ion may be one of $^{171}$Yb$^+$, an ion of Mg, and an ion of Ca. In further embodiments of the invention, the operation of energizing the microwave circuit comprises energizing the microwave circuit at a frequency of approximately 12.6 GHz, thereby to excite a hyperfine transition in the trapped atomic ion.

In addition to being useful in quantum computing, various embodiments of the invention may also be advantageously applied for use in local addressing of magnetic states, use of on-chip magnetic fields, atomic clocks, integrated magnetic field sensing, and microwave communication.

BRIEF DESCRIPTION OF THE DRAWING

In the drawing:

FIG. 8, which includes FIG. 8a-8d, shows a top view of the metallization stack-up from the bottom layer closest to the substrate to the topmost of the entirety of the illustrative ion trap of FIG. 3.

DETAILED DESCRIPTION

The following merely illustrates the principles of the invention. It will thus be appreciated that those skilled in the art will be able to devise various arrangements that, although not explicitly described or shown herein, embody the principles of the invention and are included within its spirit and scope. Furthermore, all examples and conditional language recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry or components embodying the principles of the invention.

In the claims hereof any element expressed as a means for performing a specified function is intended to encompass any way of performing that function. The invention as defined by such claims resides in the fact that the functionalities provided by the various recited means are combined and brought together in the manner which the claims call for. Applicant thus regards any means which can provide those functionalities as equivalent as those shown herein.

Unless otherwise explicitly specified herein, the drawings are not drawn to scale.

Figure 1:
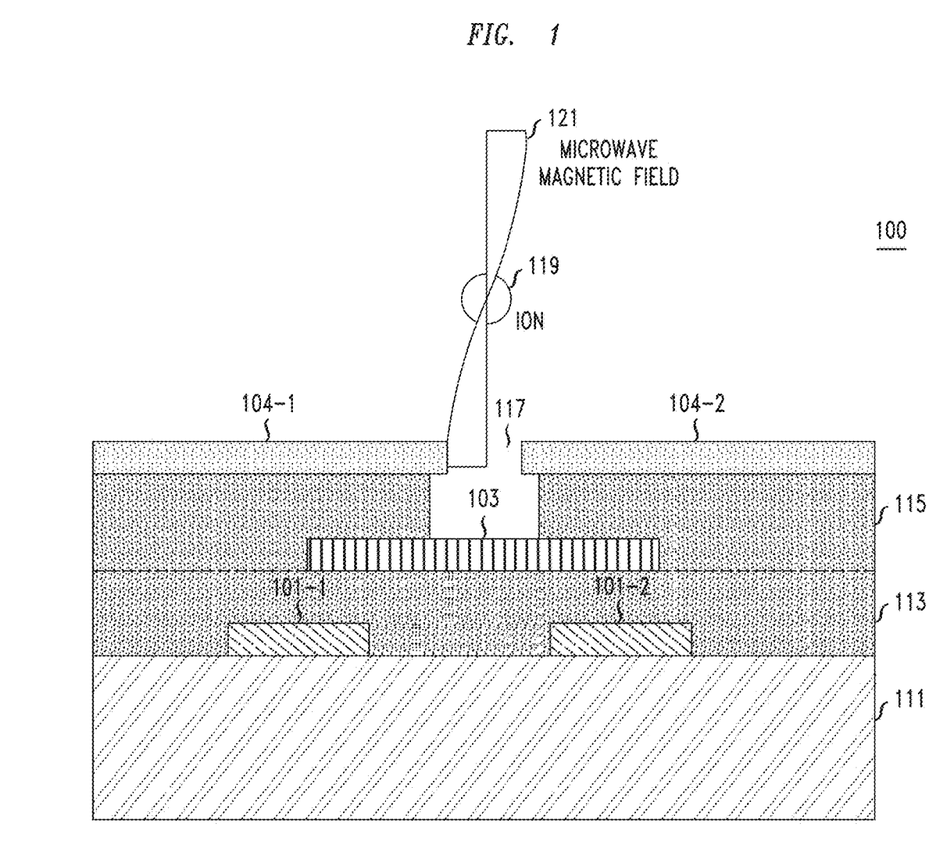
FIG. 1 shows a simplified conceptual view of a cross section of an ion trap arranged in accordance with the principles of the invention.

To address the issues with the use of microwaves for ion traps, among others, embodiments of the invention employ a multilayer routing approach to providing the microwaves and other signals that make up the ion trap. To this end, FIG. 1 shows a simplified conceptual view of a cross section of ion trap 100 arranged in accordance with the principles of the invention. More specifically, shown in FIG. 1 are substrate 111, microwave metal layer 101, dielectric layer 113, routing metal layer 103, dielectric layer 115, and trap metal layer 104.

Substrate 111 may be any suitable substrate for use in building ion trap 100. One exemplary such substrate material is high-resistivity silicon.

Metal layers 101, 103, and 104 may be any suitable metal. Generally, the design is not dependent on the specific metal employed. Also, each of the metal layers need not be made of the same metal. The same is true for each of microwave lines 101-1 and 101-2 which collectively make up microwave metal layer 101. While any metal may be employed, preferably the metal should be a good conductor. Such good conductors include an aluminum copper alloy, aluminum, copper, and gold, Each of microwave lines 101-1 and 101-2 may carry current which may flow in opposite directions, e.g., to create a whole or partial loop. The current is at a suitable microwave frequency chosen, as is well known to those of ordinary skill in the art, for use in an ion trap or the particular application to which the structure will be put. As a result of the current a magnetic field is generated in space at the same microwave frequency of the current carried by microwave lines 101-1 and 101-2. The microwave frequency current may be generated off the chip on which ion trap 100 is formed and then supplied to microwave lines 101-1 and 101-2 via on-chip pads, or generated on-chip integrated active electronics. In one embodiment of the invention, microwave lines 101-1 and 101-2 may be arranged as two concentric whole or partial loops.

Note that while opposing and equal microwave currents are most common and useful, the microwave currents do not necessarily need to be opposing or equal. Furthermore, other embodiments of the invention may be arranged with other configurations such as a single-wire microwave trap with current flowing along only one wire, such that there would only be a single microwave line 101-1 or traps with more than three wires, where there would be three or more microwave lines, such extra microwave lines not being shown in FIG. 1, where the currents are chosen to obtain a specific effect.

It is helpful to place the various lines, e.g., microwave lines 101-1 and 101-2, of microwave metal layer 101 in direct contact with substrate 111 to prevent overheating of the circuit. For electrical isolation, a heterolayer of low-stress silicon nitride (LSN) (not shown) can be added to the top of substrate 111, just below the first metallization layer. Alternatively, for better thermal management, a heterolayer of material having a higher thermal conductivity than silicon can be added to the top of the substrate, just below microwave metal layer 101. Examples of materials suitable for that purpose include silicon carbide and aluminum nitride.

As is well-known in the art, microwave lines 101-1 and 101-2 are desirably impedance matched to a source impedance of 50Ω. Although a microwave matching network could be fabricated on substrate 111, it may be preferable for at least some purposes to provide the matching network on a separate substrate. This would relax geometrical constraints and would avoid the danger of unforeseen electrical parasitics. For example, the matching network can be added to an interposer that is used to provide the control signals discussed hereinbelow. One well-known matching technique that may be useful in this regard employs a single stub match. This is a simple, effective, but narrowband technique. A narrow bandwidth is acceptable, however, because the microwave signal to be used is likewise a narrowband signal.

Each of dielectric layers 113 and 115 are made of a suitable dielectric material, e.g., silicon dioxide. Each of dielectric layers 113 and 115 may be fabricated from a different material. Dielectric layer 113 extends over substrate 111 and microwave metal layer 101 up to the height of the side of gap coverage layer 103 that is proximal to substrate 111. Dielectric layer 115 extends over dielectric layer 113 and gap coverage layer 103 up to the height of the side of gap coverage layer 103 that is proximal to substrate 111.

Trap metal layer 104 is farthest from substrate 111 and is nearest to ion 119. Trap metal layer 104 includes topside metal pads 104 which may be connected to a signal source or voltage level and in such a case are referred to as topside electrodes 104 or ion-trap electrodes 104. When used as electrodes, each of topside metal pads 104 may be individually supplied with one of various types of electrical signals, referred to herein generally as control signals, which are used to control the position of ion 119. The control signals, also referred to as electrostatic signals, are analog signals at a much lower frequency than the microwave range, e.g., from to DC up to, e.g., approximately 10 MHz. These control signals are used to shuttle ions along the RF "tracks" when the application is an ion trap. More specifically, such control signals may be programmed waveforms.

For example, one of topside electrodes 104 may be connected to one of various electrostatic control signals to provide for positional control of ion 119. Another one of topside electrodes 104 may be connected to the electrical ground of trap 119 to provide a fixed electrical potential. Yet another of topside metal pads 104 may not be connected to any electrical source and is simply allowed to float electrically.

In addition, various ones of topside electrodes 104 may be connected to a radio frequency (RF) signal. Typically the RF signal is routed only on trap metal layer 104, but it may also be routed on other layers if direct routing is blocked by the use of other layers as described hereinbelow. These radio-frequency trap electrodes 104 are driven with a continuous high-voltage, e.g., in the range of about 60 V to about 200 V, radio frequency signal, e.g., with a frequency range of about 80 MHz to about 200 MHz, that creates a pseudopotential well that extends the length of the trap, e.g., along the "railroad track", e.g., as shown in FIG. 9c or 9d. Radio frequency trap electrodes 104 (FIG. 1) are physically designed to create a field null in the space above the centerline of the trap where the ion is trapped. This null can be thought of as a tube that is located some distance above the surface of the trap, e.g., at 33 μm in one embodiment of the invention, and which extends along the length of the trap. This provides containment of the ion in the radial dimension, so that the ion is kept suspended in space above the trap and along the centerline of the "railroad track". Because the null is a "tube" it does nothing to hold the ion in any given place along the length of the trap.

The low-frequency electrostatic control signals are analog waveforms that are used to trap the ion in the remaining direction along the length of the trap. When it is desired to hold the ion in one place along the track, these electrodes are held at a fixed value to create a static potential well along the axis of the trap. When it is desired to move the ion along the track, these voltages are changed to move the potential well, and the ion in it, along the length of the trap.

FIG. 1 shows illustrative topside metal pads 104 which are electrodes and hence referred to as topside electrodes 104-1 and 104-2, collectively topside electrodes 104. Note that the routing of signals to topside electrodes 104 is not shown in FIG. 1. This is because FIG. 1 is a cross-sectional view and the routing of signals may be achieved in another cross-section.

Gap 117 is formed between topside electrodes 104-1 and 104-2. The microwave magnetic field generated by microwave lines 101-1 and 101-2 flows upwards and passes through gap 117 to interact with ion 119 as represented, e.g., by microwave magnetic field 121. Gap 117 may be of any suitable shape. One such shape is "slot" shaped.

Gap coverage metal layer 103 shields gap 117 from being directly exposed to microwave lines 101-1 and 101-2. In the summary, this was referred to as shield layer M3 in the four metal layer structure and M4 in the five metal layer structure. Thus, in accordance with an aspect of the invention, there is no line of sight from microwave lines 101-1 and 101-2 to the space above metal layer 104.

Gap coverage metal layer 103 may also play an additional role of carrying individual electrostatic control signals in regions not in the vicinity of gap 117.

The required control signals used in a trap often dictate the location and shape of topside metal pads 104, which limits the freedom for routing of microwave lines on top of the trap. This limitation is overcome, in accordance with an aspect of the invention, by allowing the microwave lines to be routed on underlying metal layers, thereby, advantageously, providing more space and design freedom for the microwave signals.

As such, the control signals are routed from pads (not shown) at the edges of the die of ion trap 100 to the specific one or ones of topside metal pads 104, e.g., topside electrodes 104-1 and 104-2. In accordance with an aspect of the invention, to prevent electrical interference with ion 119, the metal conductors carrying the control signals are always covered by another metal layer above them, so that the only place that the control signals are exposed to the space above ion trap 100 is where they are brought up intentionally to one of the topside electrodes of metal layer 104 with a via. Such vias are not shown in FIG. 1 but shown and discussed below in connection with FIG. 2. Note that the control signals can be run on conductors in metal layer 103 or on additional underlying layers.

A structure such as shown in FIG. 1 may be formed in the conventional manner through deposition and etching as is well known to one of ordinary skill in the art.

To form an actual trap, multiple structures similar to that shown in FIG. 1 may be integrated on a single substrate forming a series of gaps through which microwave magnetic fields pass to cooperatively trap an ion and keep it in place and to appropriately address it for quantum computing. Similar gaps are present in numerous trap designs known to those of ordinary skill in the art. Such gaps can be used as is, or they can be modified for more precise tailoring of the magnetic field. For example, additional gap area can be added by subdividing selected electrodes. It will be understood, of course, that the electrodes are supported by an underlying interlayer dielectric.

It can be seen that gap coverage metal layer 103 is used to provide metal coverage underneath gaps 117 in top metal layer 104. Advantageously, and in accordance with an aspect of the invention, the metal on gap coverage metal layer 103 is laid out in such a way that from the point of view of trapped atomic ion 119 the combined metal of gap coverage metal layer 103 and top metal layer 104 is equivalent to a continuous metal plane. This serves the purpose of shielding the trapped ion from the electric fields of charges trapped at dielectric boundaries. For that reason, it is also advantageous to include an air gap extending through dielectric layer 115 from the bottom of each gap 117 to the metal in gap coverage metal layer 103, e.g., in the manner shown. Note the overlap of the metal of topside metal pads 104 over gap 117 is required so that the metal of topside metal pads 104 shields ion 119 from the dielectric in order to allow for situations where the ion is not directly above the opening of the particular gap 117. More specifically, the dielectric undercut should be large enough that the ion does not "see" the dielectric from any possible location along the trap. The required undercut may be calculated by one of ordinary skill in the art if the ion height and gap geometry are known. As is well known to those of ordinary skill in the art, the undercut may be made by selective etching of the dielectric underneath topside metal pads 104.

Note that by appropriately placing the microwave lines so that, for example, they are always shielded by top metal layer 104 allows one to employ the principles of the invention in fabricating an ion trap without using gap coverage metal layer 103.

Figure 2:
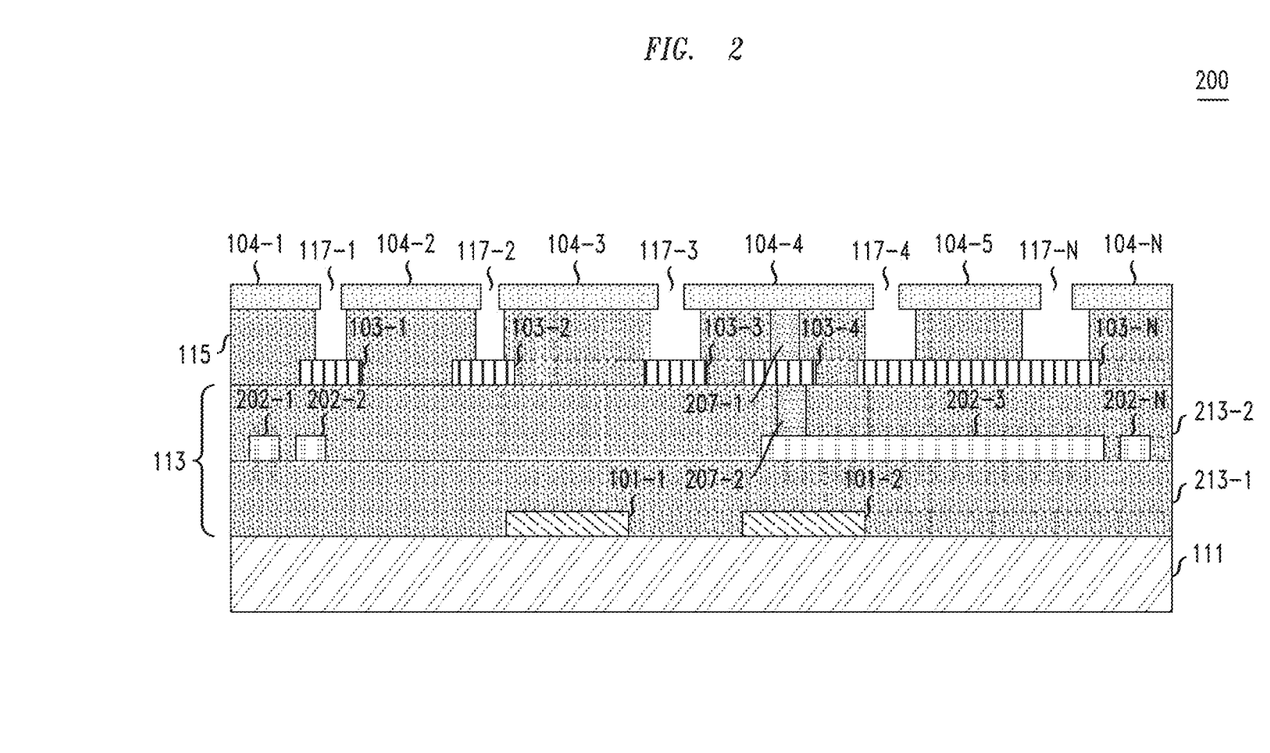
FIG. 2 shows a more detailed conceptual representative cross section of a four-metal-layer process in which the control signals for the ion-trap electrodes are included on top metal layer and the microwave circuit is on an underlying microwave metal layer.

FIG. 2 shows a more detailed conceptual representative cross section of a four-metal-layer process in which the control signals for the ion-trap electrodes are included on top metal layer 104, which in this instance is metal layer 4, and the microwave circuit is on underlying microwave metal layer 101, namely metal layer 1. More specifically, FIG. 2 shows, similar to FIG. 1, substrate 111, microwave metal layer 101, dielectric layer 113, routing metal layer 103, dielectric layer 115, and trap metal layer 104. In addition, FIG. 2 shows control signal routing metallization layer 202 and vias 207.

More specifically, in FIG. 2, similar to FIG. 1, substrate 111 may be any suitable substrate for use in building ion trap 200. One exemplary such substrate material is high-resistivity silicon.

Also, similar to FIG. 1, metal layers 101, 102, 103, and 104 may be any suitable metal. Generally, the design is not dependent on the specific metal employed. Also, each of the metal layers need not be made of the same metal. The same is true for each of microwave lines 101-1 and 101-2 which collectively make up microwave metal layer 101. While any metal may be employed, preferably the metal should be a good conductor. Such good conductors include an aluminum copper alloy, aluminum, copper, and gold, Similar to FIG. 1, microwave lines 101-1 and 101-2 each carries current at microwave frequencies. In one embodiment of the invention the currents in each of microwave lines 101-1 and 101-2 are flowing in opposite directions, e.g., to create a whole or partial loop. The current is at a suitable microwave frequency chosen, as is well known to those of ordinary skill in the art, for use in an ion trap or other particular application for the structure. As a result, a magnetic field is generated in space at the microwave frequency of the current carried by microwave lines 101-1 and 101-2. The microwave-frequency current may be generated off the chip and then supplied to microwave lines 101-1 and 101-2 via on-chip pads. In one embodiment of the invention, microwave lines 101-1 and 101-2 may be arranged as two whole or partial concentric loops.

As explained in regard to FIG. 1, whereas opposing and equal microwave currents are most common and useful, the microwave currents do not necessarily need to be opposing or equal. Furthermore, other embodiments of the invention may be arranged with other configurations such as a single-wire microwave trap with current flowing along only one wire or traps with more than three wires, where the currents are chosen to obtain a specific effect.

Similar to FIG. 1, placing microwave lines 101-1 and 101-2 in direct contact with substrate 111 is helpful for preventing overheating of the circuit. For electrical isolation, a heterolayer of low-stress silicon nitride (LSN) (not shown) can be added to the top of substrate 111, just below the first metallization layer. Alternatively, for better thermal management, a heterolayer of material having a higher thermal conductivity than silicon can be added to the top of the substrate, just below microwave metal layer 101. Examples of materials suitable for that purpose include silicon carbide and aluminum nitride.

In FIG. 2, dielectric layer 113 is formed of two dielectric layers 213-1 and 213-2. Metallization layer 202, which was not represented in FIG. 1, is located between dielectric layers 213-1 and 213-2. Each of dielectric layers 213-1 and 213-2 are made of a suitable dielectric material, e.g., silicon dioxide. Each of dielectric layers 213-1 and 213-2 may be fabricated from a different material. Dielectric layer 213-1 extends over substrate 111 and microwave metal layer 101 up to the height of the side of metallization layer 202 that is proximal to substrate 111. Dielectric layer 213-2 extends over dielectric layer 213-1 and metallization layer 202 up to the height of the side of gap coverage layer 103 that is proximal to substrate 111.

Control-signal-routing metallization layer 202, which is metal layer 2, is located between dielectric layers 213-1 and 213-2. Control-signal-routing metallization layer 202 includes control-signal conductors 202-1, 202-2, 203-3, through 202-N. Control-signal-routing metallization layer 202 is typically the primary, but not necessarily the sole, metal layer that carries the control signals, e.g., for an ion trap. The various control signals, e.g., as mentioned above, are routed by control-signal-routing metallization layer 202 from pads (not shown) at the edges of the die of ion trap 200. They are delivered to a via, e.g., one of vias 207, rising up through dielectric layers 213-2 and 115 to a metal layer farther from the substrate than control-signal-routing metallization layer 202. The farther metal layer may, e.g., be gap-coverage metal layer 103 or topside electrodes 104. For example, control signal conductor 202-3 carries a control signal that is brought to via 207-2 so that the control signal can be conducted to gap-coverage metal layer conductor 103-4. From gap-coverage metal layer conductor 103-4 the control signal travels further upward through via 207-1 to 104-4 from which it can exert influence on an ion.

The number of metal layers in the trap may be increased to an arbitrary number by introducing additional metal layers to the trap that are supported by additional dielectric layers. These additional layers would have minimal impact on the microwave coupling between the microwave traces on the lower levels and the region above the trap. Such additional metal layers may be required to reduce routing complications or provide shielding between signals.

As in FIG. 1, trap metal layer 104 is farthest from substrate 111 and is nearest to the ion. Trap metal layer 104 includes topside metal pads 104 which may be connected to a signal source or voltage level and in such a case are referred to as topside electrodes 104 or ion-trap electrodes 104. Again, when used as electrodes, each of top side metal pads 104 may be individually supplied with one of various types of electrical signals, referred to herein generally as control signals, which are used to control the position of the ion.

Radio frequency (RF) signals may also be supplied directly to various topside metal electrodes 104. These radio frequency signals are generally routed only on trap metal layer 104. However, in the event that there is another topside metal pad in the way, the radio-frequency signals may be routed down to one or more other layers, e.g., by vias, routed there, and then returned to trap metal layer 104. Thus, for example, a radio-frequency signal may be introduced and run on trap metal layer 104, then routed down to gap-coverage metal layer 103, down to control-signal-routing metallization layer 202, along control-signal-routing metallization layer 202 to a new point, then up to gap coverage metal layer 103, and finally back up to trap metal layer 104.

Each of gaps 117-1, 117-2, 117-3, 117-4 through 117-N, collectively gaps 117, are formed between adjacent topside metal pads 104, which includes topside metal pads 104-1, 104-2, 104-2, 104-3, 104-4, 104-5 through 104-N and which collectively make up trap metal layer 104. In the embodiment of the invention shown in FIG. 2, it is considered that topside metal pads 104-1, 104-4, and 104-N are electrodes supplied with a controls signal, and hence may also be referred to as topside electrodes 104-1, 104-4, and 104-N, collectively topside electrodes 104. Note that only topside electrode 104-4 is actually shown in FIG. 2 as being supplied with a control signal. The control signals for topside electrodes 104-1 and 104-N may be supplied in other cross sections of ion trap 200.

The microwave magnetic field generated by microwave lines 101-1 and 101-2 flows upward and passes through each of gaps 117 for use in trapping an ion. Again, gaps 117 may be of any suitable shape and gaps 117 need not all have the same shape or the same dimensions.

Gaps 117 surround and define the shapes of topside electrodes 104. Gaps 117 are permeated by the microwave field generated by microwave lines 101-1 and 101-2 so that a microwave-frequency magnetic field is generated in the space above top metal layer 104.

Gap-coverage metal layer 103 includes gap-coverage metal layer conductors 103-1, 103-2, 103-3, 103-4 through 103-N. Some of gap-coverage metal layer conductors 103, e.g., gap-coverage metal layer conductors 103-1, 103-2, 103-3 and 103-N, shield gaps 117 from being directly exposed to microwave lines 101-1 and 101-2. In the summary, this was referred to as shield layer M3 in the four metal layer structure and M4 in the five metal layer structure further discussed hereinbelow. Thus, in accordance with an aspect of the invention, there is no line of sight from microwave lines 101-1 and 101-2 to the space above metal layer 104. Gap-coverage metal layer 103 may also play an additional role of carrying individual control signals, e.g., as is done by gap-coverage metal layer conductor 103-4.

One useful pattern for gap-coverage metal layer conductors 103 is, in effect, essentially an inverse of the pattern of gaps 117. In other words, each of gap-coverage metal layer conductors 103 can be laid out as a positive feature having the same footprint as the negative feature, i.e. the particular one of gaps 117, that lies above it. Of course, additional gap-coverage metal layer conductors 103 may also be included in the pattern when their purpose is only for routing control signals.

Dielectric layer 115 extends over dielectric layer 213-2 and control-signal-routing metallization layer 202 up to the height of the sides of topside electrodes 104 that are proximal to the substrate. Dielectric layer 115 is made of a suitable dielectric material, e.g., silicon dioxide. Dielectric layers 115 may be fabricated from a different material than either of dielectric layers 213-1 and 213-2.

The control signals are routed by control signal conductors 202, vias 207, and various conductors of gap-coverage metal layer 103 to the specific ones of topside metal pads 104, e.g., topside electrodes 104-1, 104-4, and 104-N. To prevent electrical interference with the ion being trapped, the metal conductors on metal layers 202 and 103 carrying the control signals are always covered by another metal layer above them, so that the only place that the control signals are exposed to the space above ion trap 200 is where they are brought up intentionally to one of the topside electrodes of metal layer 104 with one of vias 207. In other words, a gap-coverage metal layer 103 conductor that is used to carry a routing signal is located beneath one of topside electrodes 104. Similarly, a control signal carried on a conductor of control-signal-routing metallization layer 202 that is used to carry a routing signal is located beneath a combination of gap-coverage metal layer 103 conductors and topside electrodes 104. Thus, the control signals, when they are carried by control signal conductors 202, vias 207, or one of gap-coverage metal layer conductors 103, are shielded by metal from the space above the structure except at the particular electrode of topside electrodes 104 to which they are routed.

As in FIG. 1, by using specific microwave currents carried by microwave layer 101, a desired magnetic field profile is produced above the trap. Even when, in accordance with embodiments of the invention, the collective effect of the metal layers above the microwave traces is to completely block line-of-sight access to the ion, the magnetic field can still efficiently penetrate upward and emerge through gaps 117 into the space above the trap. Gaps 117 allow the magnetic field to penetrate by generating a time-varying electromotive force within each of gaps 117. This results in a displacement current in gaps 117 that in turn generates the magnetic field above the trap.

In an example of an ion trap made with a four-metal-layer process, the distance h of each metal layer above the surface of the lowermost dielectric, and the thickness t of each metal layer, are as follows:

M1: h=0 µm, t=2.4 µm (microwave metal layer 101)

M2: h=6.4 µm, t=1.2 µm (control signal routing metallization layer 202)

M3: h=8.6 µm, t=2.4 µm (gap coverage metal layer conductors 103)

M4: h=16.0 µm, t=2.4 µm (topside electrodes 104)

In one embodiment of the invention, the ion is trapped at a height of, for example, 33 µm above topside electrodes 104. As noted above, a magnetic field that is uniform at the position of the trapped ion is desired for operations involving single qubit rotations, but for two-qubit operations, it is desirable for the magnetic field to have a null at the position of the ion, but with a high gradient, exemplarily a gradient near 50 Tesla per meter. By appropriately controlling the counter-circulating currents in the concentric loops of microwave lines 101-1 and 101-2, a magnetic null at the position of the trapped ion is produced while still having a high field gradient at that position. This technique was reported in C. Highstrete et al., *Technology for On-Chip Qubit Control with Microfabricated Surface Ion Traps*, SAND2013-9513, Sandia National Laboratories, Albuquerque, N. Mex. (2013).

In some embodiments of the invention, at least one of the ions that is trapped may be one of $^{171}$Yb$^+$, an ion of Mg, and an ion of Ca. In further embodiments of the invention, the operation of energizing the microwave circuit comprises energizing the microwave circuit at a frequency of approximately 12.6 GHz, thereby to excite a hyperfine transition in the trapped ion.

Figure 3:
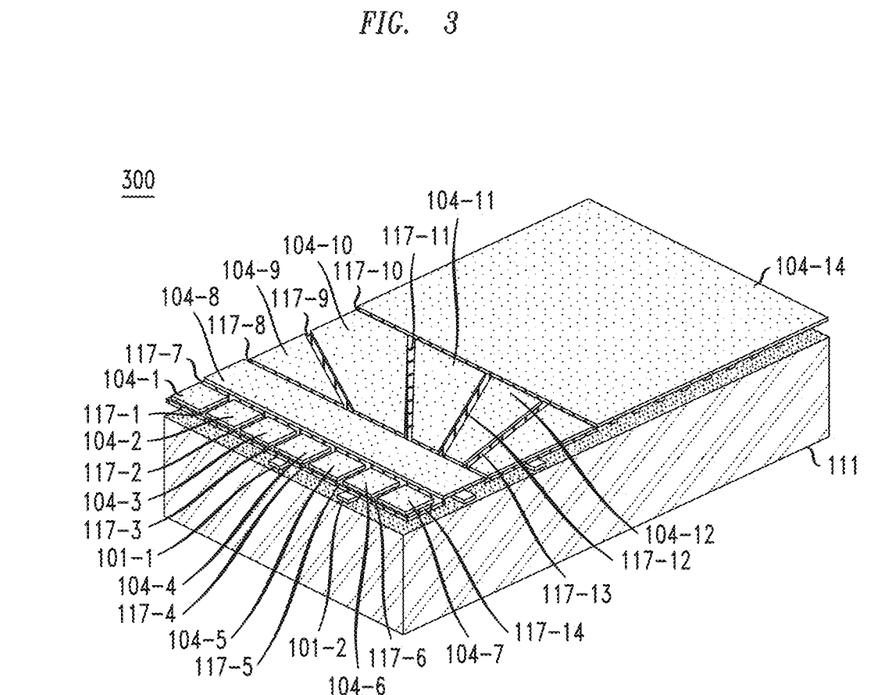
FIG. 3 shows a partial quarter view of illustrative ion trap arranged in accordance with the invention.
Figure 4:
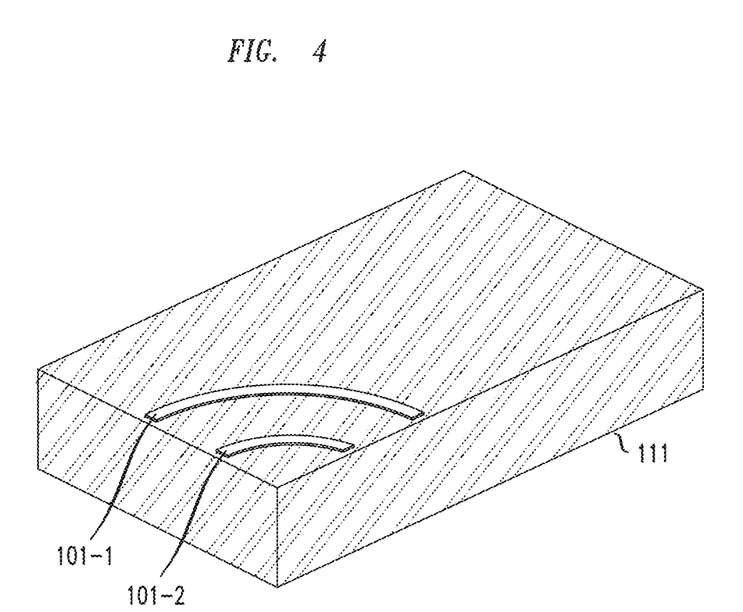
FIGS. 4-7 show further details in the stack-up of the metalization layers starting from the bottom for the illustrative ion trap of FIG. 3.

FIG. 3 shows a partial quarter view of illustrative ion trap 300 arranged in accordance with the principles of the invention. Further details are shown in FIGS. 4-8 as the stack-up of the metallization layers starting from the bottom, i.e., the lowest layers of substrate 111 and microwave layer 101. For clarity of exposition and ease of understanding, the same numbers employed in FIGS. 1 and 2 are employed where possible for corresponding components and layers in FIGS. 4-10. Thus, easy reference may be made back to the descriptions of the corresponding components and layers. Furthermore, the dielectric layers are omitted from FIGS. 3-10 because including them would wholly or partially obscure the metallization structure FIG. 4 shows microwave lines 101-1 and 101-2 of metal layer 101 formed upon substrate 111. As mentioned, in one illustrative embodiment of the invention, microwave lines 101-1 and 101-2 may be arranged as two whole or partial concentric loops. Such an arrangement is better appreciated from FIG. 3 than from FIGS. 1 and 2.

Figure 5:
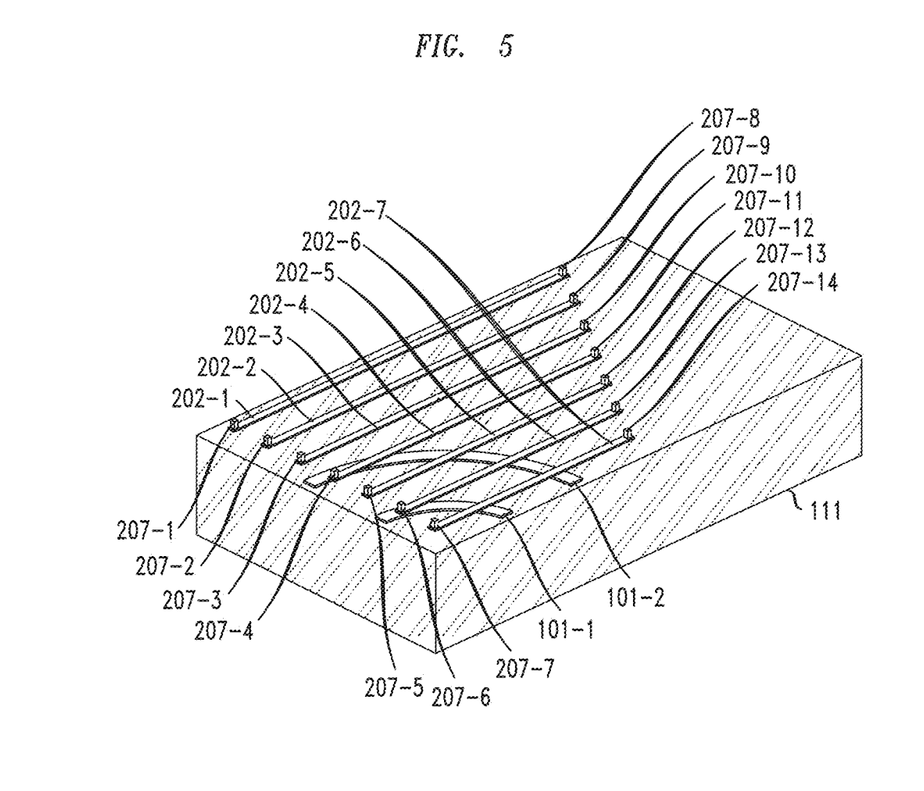

FIG. 5 shows control-signal-routing metallization layer 202, including control signal conductors 202-1 through 202-7, and vias 207, including vias 207-1 through 207-14. It should be remembered that between microwave lines 101 and control-signal-routing metallization layer 202 is dielectric layer 213-1 (not shown in FIG. 5 but shown in FIG. 2), on which control-signal-routing metallization layer 202 is formed.

Figure 6:
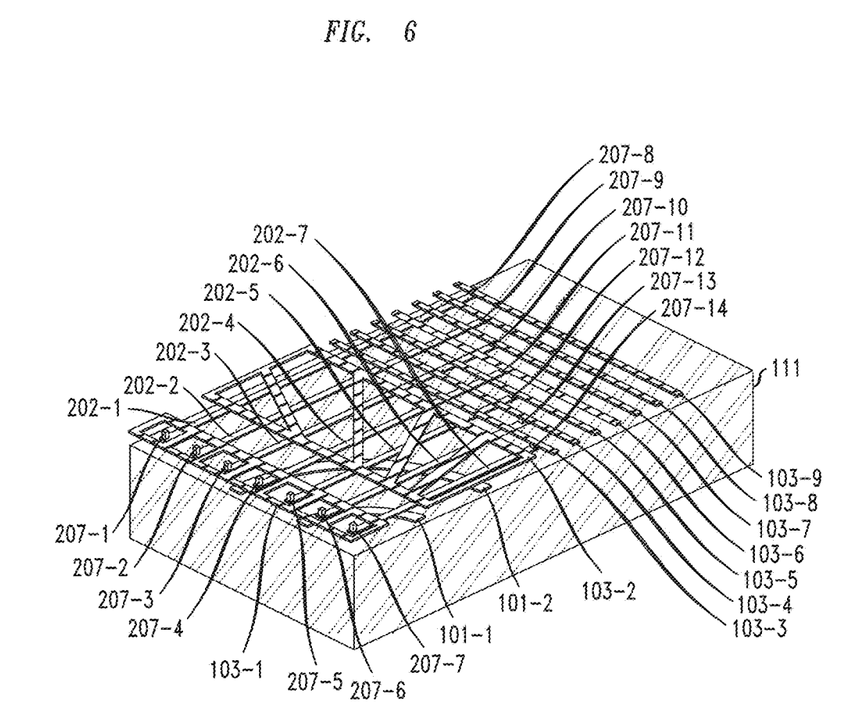
Figure 7:
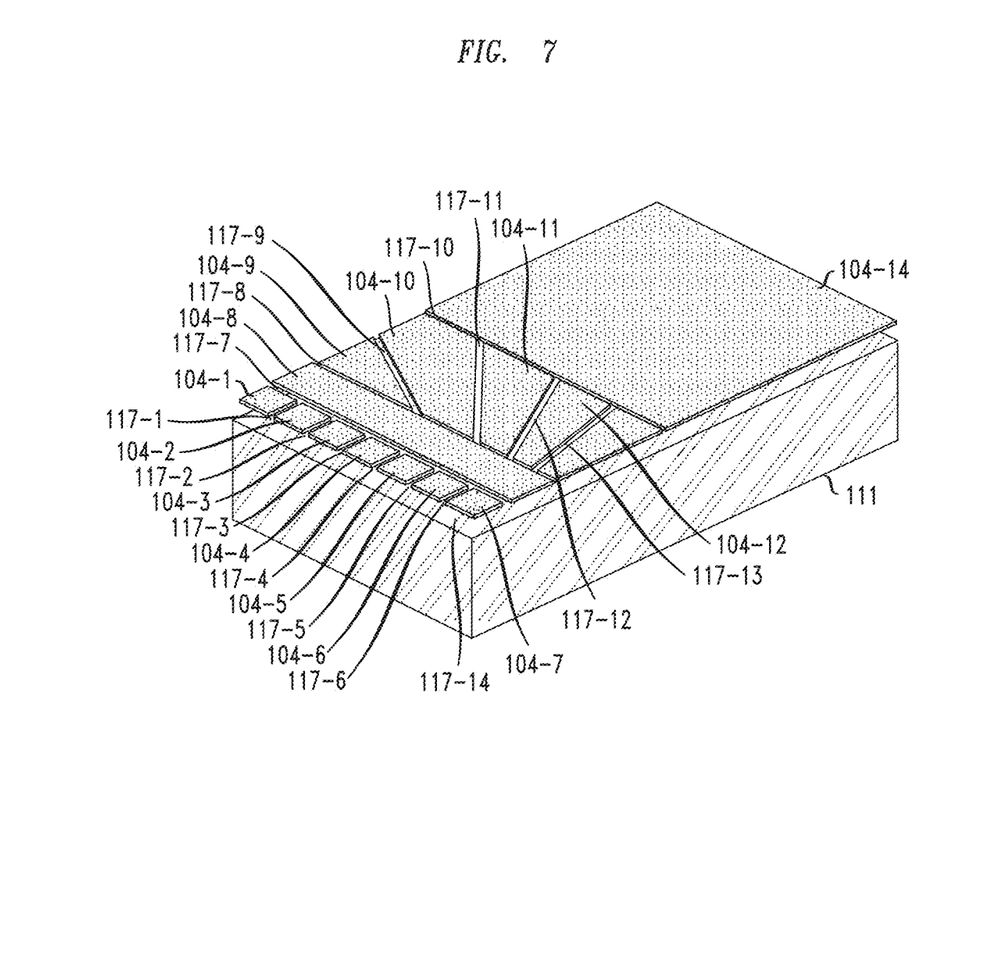

FIG. 6 shows the addition of gap-coverage metal layer 103. In particular, the figure includes gap-coverage metal layer conductors 103-1 and 103-2, which shield gaps 117 from being directly exposed to microwave lines 101-1 and 101-2. In addition, gap-coverage metal layer conductors 103-3 through 103-10 are used for carrying individual control signals. Gap-coverage metal layer conductors 103-3 through 103-10 are outside of the region of the microwave region of the trap and are connected, illustratively, to respective ones of vias 207-8 through 207-14. It should be remembered that between control-signal-routing metallization layer 202 and gap-coverage metal layer 103 is dielectric layer 213-2 (not shown in FIG. 5 but shown in FIG. 2), on which gap-coverage metal layer 103 is formed FIG. 7 shows topside metal pads 104, including topside metal electrodes 104-1 through 104-13 and topside metal pad 104-14. Also shown in FIG. 7 are gaps 117-1 through 117-14. Topside metal pads 104 are formed on top of dielectric layer 115 (represented in FIGS. 1 and 2 but not shown in FIG. 7).

Figure 8A:
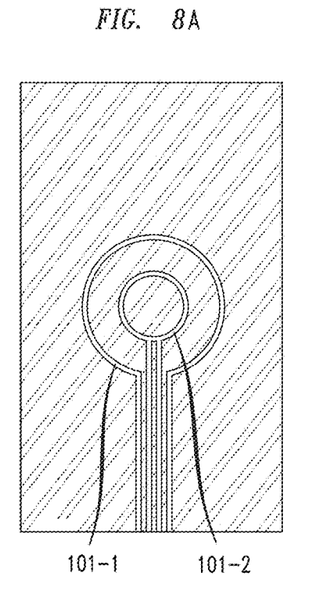
Figure 8B:
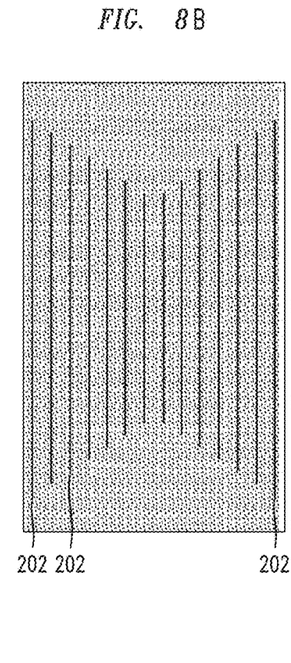
Figure 8C:
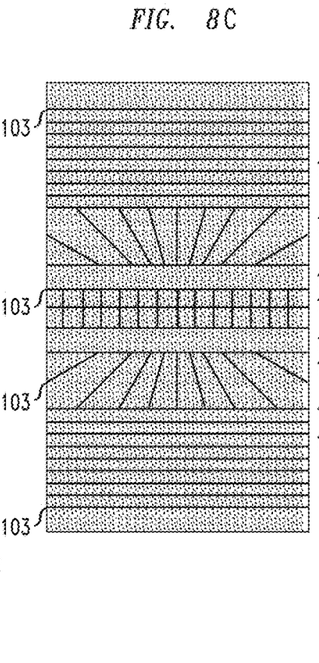
Figure 8D:
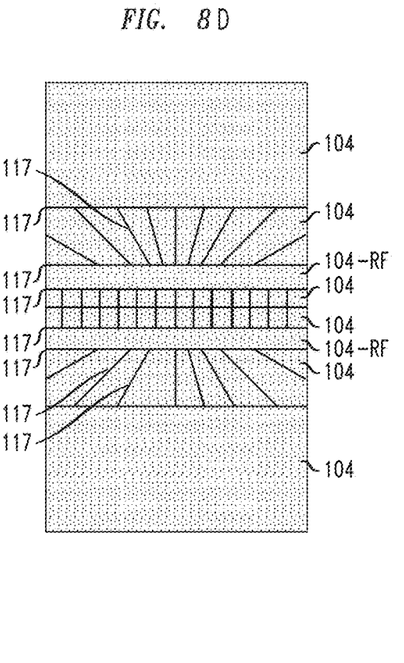

FIG. 8, which includes FIGS. 8a-8d, shows a top view of the metallization stack-up from the bottom layer closest to the substrate to the topmost of the entirety of the ion trap of FIG. 3. In FIG. 8 only some of the conductors are provided with reference numerals, but a sufficient number have been so provided that, in view of the earlier figures, one of ordinary skill in the art will be able to understand the structure. Thus, FIG. 8a shows microwave lines 101-1 and 101-2 along with the microwave traces that feed the complete and nearly complete loops. FIG. 8b shows control-signal-routing metallization layer 202, which would overlie microwave lines 101-1 and 101-2. Note that because this is a top view, the vias cannot be seen. FIG. 8c shows gap-coverage metal layer 103, which runs under gaps 107 and which also may be arranged to conduct signals as necessary. FIG. 8d shows topside metal pads 104 which in this embodiment are all topside metal electrodes 104. All of topside metal electrodes 104 in FIG. 8d carry control signals except topside metal electrodes 104-RF which carry RF signals. Electrodes 104-RF are the "railroad tracks" mentioned above. Also, shown in FIG. 8d are gaps 117 between topside metal pads 104.

In accordance with an embodiment of the invention, in operation, a null is generated in the space above the trap by counter-circulating microwave currents introduced onto two concentric microwave lines 101 that are formed as loops 101 on bottommost metal layer 101. The height of the microwave null can be changed by changing the ratio of the current magnitudes between the two microwave lines 101, and the strength of the microwave field gradient at the null may be changed by changing the values of the two currents together while maintaining the ratio. It is often desired that the height of the microwave null match the height of the trapped ion, which is determined by the geometry of topside metal pads 104, and in particular, those of topside metal pads 104 that are electrodes supplied with RF signals. The height and the RF electrode geometry may determined by one of ordinary skill in the art for the particular application.

It should be noted that the microwave null is typically desired for two-qubit operation, whereas a uniform field is typically desired for single-qubit operations. A uniform field may be generated with currents going in the same direction on both of microwave lines 101. In both cases, the RF null and the ion or ions are desired to be in the same place. It is well known to those of ordinary skill in the art that two-qubit gates require two ions in the same well of the ion trap, and thus, in some embodiments of the invention, there can be multiple ions in the same well.

Also, the ion interacts with the magnetic component of the microwave field as will be readily apparent to one of ordinary skill in the art. Thus, for clarity, it should be understood that when reference is made to interactions of the microwave field with the ion, the interaction being referred to is that due to the microwave magnetic field.

Figure 9:
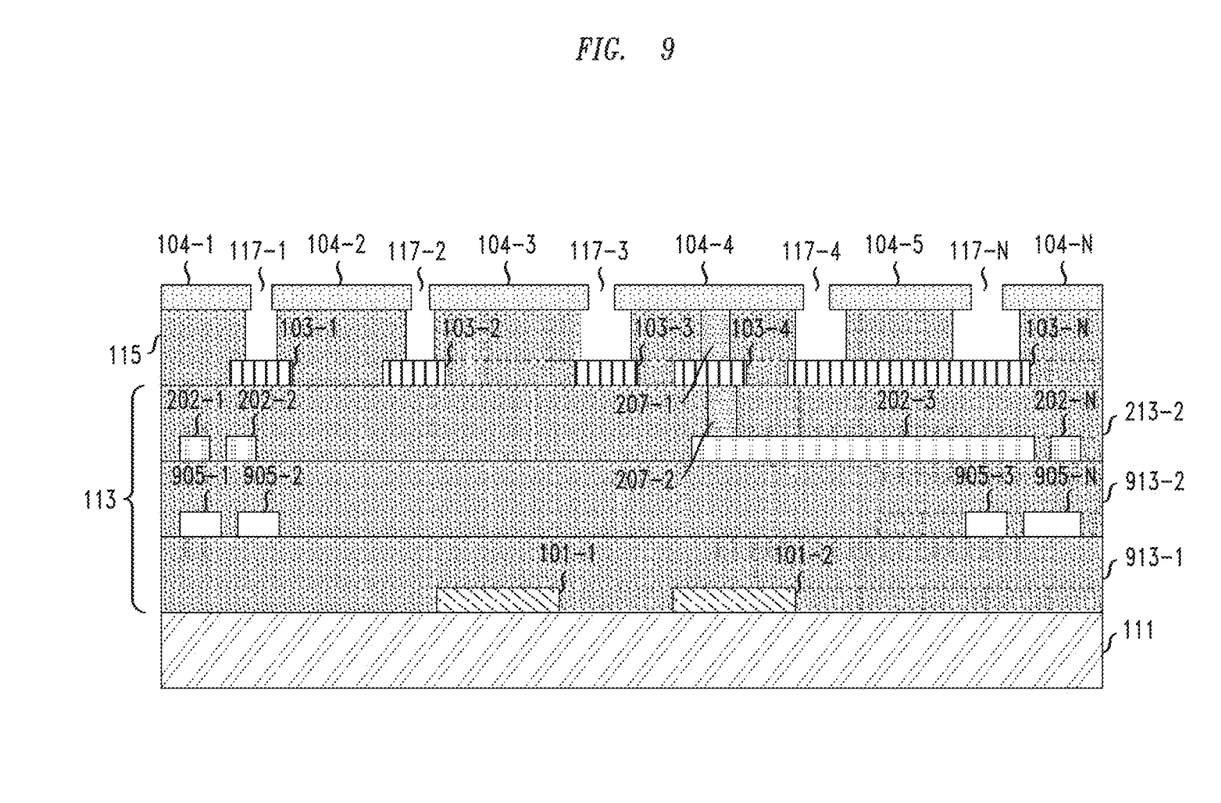
FIG. 9 shows an illustrative embodiment of the invention using a five-metal-layer process.

The invention may also be embodied in a five-layer process. The five-metal-layer structure includes an additional intermediate layer that provides for additional routing of the control signals and can also be used as an additional shielding layer. Such an embodiment is shown in FIG. 9. In contrast to FIG. 2 on which the embodiment is based, the new fifth metal layer is secondary control-signal metal layer 905, which includes secondary control-signal conductors 905-1 through 905-N. Secondary control-signal conductors 905 are similar to control-signal conductors 202. Also, dielectric layer 113 is made up of dielectric layers 213-2, 913-1, and 913-2. Dielectric layer 213-2 is the same as shown in FIG. 2. Dielectric layer 913-1 is between microwave metal layer 101 and secondary control-signal metal layer 905. Similarly, dielectric layer 913-2 is between secondary control-signal metal layer 905 and control-signal-routing layer 202.

In an illustrative embodiment of the invention using a five-metal-layer process, e.g., as shown in cross-section in FIG. 9, the distance h of each metal layer above the surface of the lowermost dielectric, and the thickness t of each metal layer, are as follows:

M1: h=0 µm, t=2.4 µm (microwave metal layer 101)

M2: h=6.4 µm, t=1.2 µm secondary control signal metal layer 905)

M3: h=8.6 µm, t=1.2 µm (control signal routing metallization layer 202)

M4: h=10.8 µm, t=2.4 µm (gap coverage metal layer conductors 103

M5: h=18.2 µm, t=2.4 µm (topside electrodes 104)

The invention claimed is:

1. An ion-trapping platform comprising a substrate and a plurality of metallization layers that overlie the substrate, wherein:

the plurality of metallization layers includes at least a top layer and a microwave layer;

the top layer is patterned with metal pads including electrostatic control trap electrodes and radio-frequency trap electrodes;

the microwave layer lies below the top layer and is patterned to define a microwave circuit;

the microwave circuit is adapted to generate, in use, a microwave magnetic field that extends above the electrostatic control trap electrodes and the radio-frequency trap electrodes; and the top layer includes gaps between at least some of the metal pads that, when in use, are penetrated by microwave energy from the microwave circuit.

2. The ion-trapping platform of claim 1, wherein the gaps are shielded by a metal so that there is no direct line of sight from the microwave circuit to the space above each of the gaps.

3. The ion-trapping platform of claim 1, wherein at least one metal pad of the top layer is coupled to receive a control signal when in operation.

4. The ion-trapping platform of claim 3, wherein the control signal is a trap electrostatic control signal or a radio-frequency signal.

5. A method for manipulating energy states of an atomic ion, comprising:

energizing direct-current and radio-frequency trapping electrodes on a top surface of a platform so as to generate trapping fields, wherein said top surface contains gaps;

trapping at least one atomic ion within the trapping fields at a trapping distance above the top surface of the platform; and energizing a microwave circuit that lies within the platform beneath the trapping electrodes so as to generate a microwave-frequency magnetic field above the top surface of the platform, said magnetic field having a normal component directed perpendicular to the top surface of the platform, wherein:

the microwave-frequency magnetic field is generated from current-carrying metal traces in the microwave circuit; and there is no direct line of sight from the current-carrying coils to the trapping fields at a trapping distance above the top surface of the platform.

6. The method of claim 5, wherein the current-carrying metal traces in the microwave circuit comprise two substantially whole concentric loops, and energizing the microwave circuit comprises energizing the two substantially whole concentric loops such that the currents that the respective loops are carrying generate respective magnetic fields having oppositely-directed normal components directed perpendicular to the top surface of the platform.

7. The method of claim 5, wherein the current-carrying metal traces in the microwave circuit comprise two substantially whole concentric loops, and energizing the microwave circuit comprises setting currents in the respective loops so as to produce a null in the normal component of the magnetic field at the trapping distance above the top surface of the platform.

8. An ion-trapping platform arranged to provide a microwave magnetic field in a space above the platform, wherein the space above the platform is distal to a substrate on which the platform is formed, comprising:

at least one microwave generation layer conformed to generate a microwave-frequency magnetic field, each of the at least one microwave generation layer being made of metal;

a top metal layer having gaps therein and having electrostatic control trap electrodes and radio-frequency trap electrodes disposed therein; and at least one layer of metal arranged such that none of the gaps is subject to a direct line of sight from any said microwave generation layer.

9. The platform of claim 8 further comprising:

at least one control-signal metal layer disposed between the top metal layer and the at least one microwave generation layer, the at least one control-signal metal layer being conformed to carry analog control signals that are substantially lower in frequency than the microwave-frequency magnetic field.

10. The platform of claim 8, wherein the frequency of the analog control signals lies in the range 0-10 MHz.

11. The platform of claim 8, wherein the at least one layer of metal arranged such that none of the gaps is subject to a direct line of sight comprises a shield layer, the shield layer is constituted as a metallization layer situated between the top layer and the at least one microwave generation layer, and the shield layer is patterned with a plurality of metal regions, each of which lies directly beneath a corresponding gap in the top metal layer.

12. The platform of claim 8, wherein the electrostatic control trap electrodes and the radio-frequency trap electrodes are disposed exclusively in the top metal layer.

13. The platform of claim 8, wherein the at least one microwave generation layer comprises a microwave circuit disposed directly on a face of the substrate.

14. The platform of claim 8, wherein at least one insulative heterolayer, or at least one semiconductive heterolayer, or at least one insulative heterolayer and at least one semiconductive heterolayer, overlies the substrate, and wherein the at least one microwave generation layer comprises a microwave circuit disposed directly on one said heterolayer.

15. The platform of claim 8, comprising a four-level metallization structure in which a metal layer M1 nearest the substrate is overlain in succession by metal layers M2, M3, and M4, wherein M1 is a microwave generation layer, M3 is a shield layer, and M4 is the top metal layer, and the shield layer is patterned with a plurality of metal regions, each of which lies directly beneath a corresponding gap in the top metal layer.

16. The platform of claim 8, comprising a five-level metallization structure in which a metal layer M1 nearest the substrate is overlain in succession by metal layers M2, M3, M4, and M5, wherein M1 is a microwave generation layer, M4 is a shield layer, M5 is the top metal layer, and the shield layer is patterned with a plurality of metal regions, each of which lies directly beneath a corresponding gap in the top metal layer.

17. The platform of claim 8, wherein a portion of the top metal layer is configured as a ground plane and a portion of a microwave generation layer is configured as a ground plane.

18. The platform of claim 8, wherein the at least one microwave generation layer comprises a microwave circuit, and the microwave circuit comprises a pair of concentric current-carrying substantially whole loops arranged so that when energized, each said loop generates a microwave-frequency magnetic field having a component directed perpendicular to the microwave generation layer.

19. The platform of claim 18, wherein the current-carrying loops generate respective microwave-frequency magnetic fields having mutually opposing components directed perpendicular to the microwave layer in response to applied microwave-frequency current.

* * * * *